(12) United States Patent
Trantham et al.

(10) Patent No.: US 12,282,681 B2
(45) Date of Patent: Apr. 22, 2025

(54) BALANCING POWER, ENDURANCE AND LATENCY IN A FERROELECTRIC MEMORY

(71) Applicant: Seagate Technology LLC, Fremont, CA (US)

(72) Inventors: Jon D. Trantham, Chanhassen, MN (US); Praveen Viraraghavan, Chicago, IL (US); John W. Dykes, Eden Prairie, MN (US); Ian J. Gilbert, Chanhassen, MN (US); Sangita Shreedharan Kalarickal, Eden Prairie, MN (US); Matthew J. Totin, Excelsior, MN (US); Mohamad El-Batal, Superior, CO (US); Darshana H. Mehta, Shakopee, MN (US)

(73) Assignee: SEAGATE TECHNOLOGY LLC, Fremont, CA (US)

( * ) Notice: Subject to any disclaimer, the term of this patent is extended or adjusted under 35 U.S.C. 154(b) by 0 days.

(21) Appl. No.: 17/841,083

(22) Filed: Jun. 15, 2022

(65) Prior Publication Data
US 2022/0405003 A1 Dec. 22, 2022

Related U.S. Application Data

(60) Provisional application No. 63/211,821, filed on Jun. 17, 2021.

(51) Int. Cl.
*G06F 3/06* (2006.01)
(52) U.S. Cl.
CPC .......... *G06F 3/0653* (2013.01); *G06F 3/0611* (2013.01); *G06F 3/0619* (2013.01); *G06F 3/0625* (2013.01); *G06F 3/0679* (2013.01)

(58) Field of Classification Search
CPC .... G06F 3/0653; G06F 3/0611; G06F 3/0619; G06F 3/0625; G06F 3/0679;
(Continued)

(56) References Cited

U.S. PATENT DOCUMENTS

| 5,495,438 A | 2/1996 | Koike |
| 5,600,587 A | 2/1997 | Koike |

(Continued)

*Primary Examiner* — Hosain T Alam
*Assistant Examiner* — Zubair Ahmed
(74) *Attorney, Agent, or Firm* — HOLZER PATEL DRENNAN

(57) ABSTRACT

Apparatus and method for managing data in a non-volatile memory (NVM) having an array of ferroelectric memory cells (FMEs). A data set received from an external client device is programmed to a group of the FMEs at a target location in the NVM using a selected profile. The selected profile provides different program characteristics, such as applied voltage magnitude and pulse duration, to achieve desired levels of power used during the program operation, endurance of the data set, and latency effects associated with a subsequent read operation to retrieve the data set. The profile may be selected from among a plurality of profiles for different operational conditions. The ferroelectric NVM may form a portion of a solid-state drive (SSD) storage device. Different types of FMEs may be utilized including ferroelectric tunneling junctions (FTJs), ferroelectric random access memory (FeRAM), and ferroelectric field effect transistors (FeFETs).

20 Claims, 5 Drawing Sheets

(58) Field of Classification Search
CPC .............. G11C 11/161; G11C 11/1673; G11C 11/1675; G11C 11/223; G11C 11/2273; G11C 11/2275; G11C 11/221
See application file for complete search history.

(56) References Cited

U.S. PATENT DOCUMENTS

| | | | |
|---|---|---|---|
| 5,784,310 A | 7/1998 | Cuchiaro et al. | |
| 6,157,979 A * | 12/2000 | Barnett .................. | G06F 13/16 713/340 |
| 6,639,824 B1 * | 10/2003 | Wohlfahrt ............... | G11C 11/22 365/189.09 |
| 7,599,208 B2 | 10/2009 | Kang | |
| 8,312,204 B2 | 11/2012 | Zhang et al. | |
| 9,070,481 B1 * | 6/2015 | Ellis ....................... | G11C 29/42 |
| 9,110,787 B2 | 8/2015 | Cornwell et al. | |
| 9,201,728 B2 | 12/2015 | Patapoutian et al. | |
| 9,595,320 B2 | 3/2017 | Wu et al. | |
| 9,852,788 B2 | 12/2017 | Kim | |
| 10,038,092 B1 | 7/2018 | Chen et al. | |
| 2004/0165414 A1 * | 8/2004 | Kushida ................ | G11C 11/412 365/154 |
| 2012/0297120 A1 * | 11/2012 | Fillere ................. | G06F 12/0223 711/E12.008 |
| 2012/0314477 A1 * | 12/2012 | Siau ................... | G11C 13/0097 365/148 |
| 2012/0317343 A1 * | 12/2012 | Fuchikami .......... | G06F 12/0246 711/E12.008 |
| 2016/0336069 A1 * | 11/2016 | Lin ..................... | G11C 11/5657 |
| 2017/0343987 A1 * | 11/2017 | Jayakumar ........... | G06F 11/3013 |
| 2022/0043590 A1 * | 2/2022 | Grosz .................. | G06F 1/3275 |

* cited by examiner

FERROELECTRIC TUNNEL JUNCTION (FTJ)

FeRAM (1T-1C) FERROELECTRIC CAPACITOR MEMORY CELL

FeFET MEMORY CELL

POWER MANAGEMENT

BALANCING POWER, ENDURANCE AND LATENCY IN A FERROELECTRIC MEMORY

RELATED APPLICATION

The present application makes a claim of domestic priority to U.S. Provisional Application No. 63/211,821 filed Jun. 17, 2021, the contents of which are hereby incorporated by reference.

SUMMARY

Various embodiments of the present disclosure are generally directed to a memory storage system that incorporates ferroelectric memory elements (FMEs) and a control system that manages the storage of data to the FMEs that balances power, endurance and latency characteristics of the FMEs.

Without limitation, some embodiments operate to program a data set received from an external client device to a group of FMEs at a target location using a selected profile. The selected profile provides different program characteristics, such as applied voltage magnitude and pulse duration, to achieve desired levels of power used during the program operation, endurance of the data set, and latency effects associated with a subsequent read operation to retrieve the data set.

The profile may be selected from among a plurality of profiles for different operational conditions. Different types of FMEs may be utilized including ferroelectric tunneling junctions (FTJs), ferroelectric random access memory (FeRAM), and ferroelectric field effect transistors (FeFETs).

These and other features and advantages of various embodiments can be understood from a review of the following detailed description in conjunction with the accompanying drawings.

DETAILED DISCUSSION

Figure 1:
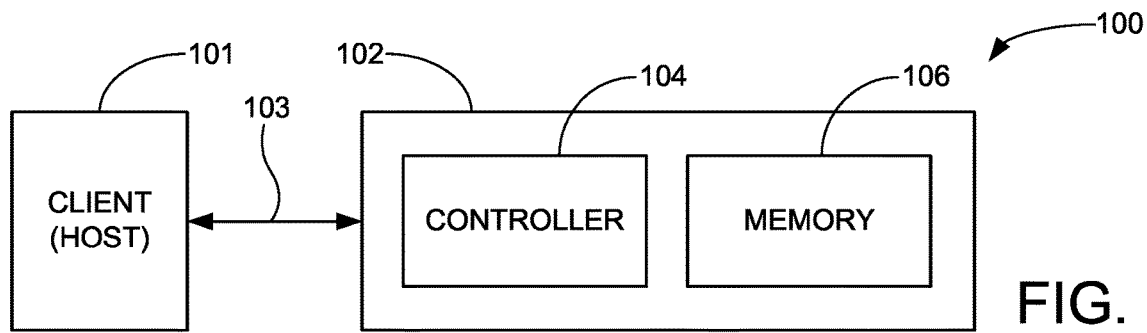
FIG. 1 is a functional block diagram of a data processing system constructed and operated in accordance with various embodiments.

Various embodiments of the present disclosure are generally directed to systems and methods for providing a ferroelectric memory with control characteristics that balance various operational parameters associated with the memory, such as power, endurance and latency.

FMEs are semiconductor based memory cells that provide non-volatile data storage with fast response and low power consumption characteristics. A typical FME includes a stack of layers that includes at least one ferroelectric layer which stores data in relation to a programmed and retained electrical field orientation of the layer. The ferroelectric orientation provides different current response characteristics, such as differences in voltage drop across the layer or electrical resistance of the layer. These differences allow the layer to store one or more data storage bits in a non-volatile fashion.

FMEs can be configured in a number of ways to include additional layers including but not limited to an electrode layer, an interposed layer (such as a tunneling layer or a dielectric layer), a metallic layer, a channel region, etc. As noted above, one or more data bits can be stored by each FME based on the programmed electric polarity, or polarities, of the ferroelectric layer(s) of the FME.

A variety of FME constructions have been proposed. These include ferroelectric tunneling junctions (FTJs), ferroelectric field effect transistors (FeFETs), and ferroelectric random access memory (FeRAM). Other forms of FMEs have been proposed as well.

Generally, FTJs are somewhat analogous to magnetic tunneling junctions (MTJs) and are usually arranged as two-junction cells with a ferroelectric layer and a tunneling barrier layer sandwiched between opposing electrodes. FTJs are particularly suitable for cross-point arrays and other architectures with two connection points to each memory element.

FeFETs are somewhat analogous to flash memory cells and generally include a gate structure arranged between respective source and drain doped regions. The gate structure includes a ferroelectric layer which is programmed to have a selected electrical polarity that changes the source-drain connectivity of the cell. FeFETs usually have three-junctions (drain, source, gate) and can be readily arranged into two-dimensional (2D) or three-dimensional (3D) structures.

FeRAM cells are somewhat analogous to DRAM cells and are usually arranged with at least one transistor and at least one capacitor. The capacitor includes a ferroelectric layer. A tunneling barrier layer may also be provided in the capacitor. A number of FeRAM arrangements have been proposed, including 1T1FC (one-transistor, one-ferroelectric capacitor) cells, 2T2C cells, 1T4C cells, 6T4C cells, etc. The transistor in each FeRAM cell may be a traditional transistor (e.g., a conventional field effect transistor, FET), although in some cases ferroelectric layer(s) can be applied to the gate structure of the transistor as well as to the capacitor ("dual layer FeRAM"). The impressed electrical polarity of the ferroelectric layer(s) in the capacitor(s) and, as required, the transistor(s), establishes the programmed state of the cell.

A variety of materials, metals and alloys can be used to make up the respective ferroelectric, tunneling and electrode layers. Suitable materials for the ferroelectric layer can include, without limitation, $HfO2$, $ZrO2$, $Hf1-xZxO2$, etc. These materials may be doped with other elements such as but not limited to Si, Ge, Al, Ti, Sc, Y, La, Ce, Gd, Nb, Sr, Ba, N, etc. The tunneling layer(s) may be a suitable non-ferroelectric dielectric including, but not limited to $Al2O3$, $MgO$, $SrTiO3$, etc. Electrodes are electrically conductive material and may include, without limitation, TiN, TaN, Pt, Ag, CrRu, CrMo, CrW, CrTi, and RuAl. In some cases, anti-ferroelectric materials such as $ZrO2$ may be used in the place of the ferroelectric layer if an internal bias field, e.g., from two dissimilar electrodes, is introduced in order to shift its hysteresis loop to enable the storage of binary information. These and other examples are merely illustrative and are not limiting.

Various embodiments of the present disclosure are directed to a method and apparatus for storing data using ferroelectric memory element (FME) cells using a controller circuit that balances various operational parameters such as power, endurance, and latency to optimize data storage characteristics in the FME cells.

FMEs store data in relation to the strength and endurance of the impressed electric field in the ferroelectric layer. The following terms relate to the manner in which FMEs can be programmed, how quickly the FMEs can be read, and how long the FMEs will tend to retain the stored information.

Power relates to what amount of power (and in at least some cases, dwell time) is required to program an FME cell. Generally, the larger amount of power (e.g., applied current magnitude, applied voltage magnitude, etc.), the "stronger" the resulting impressed electric field will be stored by the ferroelectric layer. Longer dwell times will, up to a point, also aid in developing higher magnitude electric fields. The field strength can be quantified as E, which in turn can be expressed as F/q (force per charge), where F is force and q is magnitude of charge. Standard metric units are Newtons/Coulomb. Since power is a limited resource in a storage device (or in other applications), gaining the greatest field strength from the least amount of expended power is desirable.

Endurance relates to how long a programmed FME cell can maintain a programmed state. There are three (3) main types of endurance that can be associated with FME cells: programming endurance (persistence), imprinting, and fatigue endurance (wear). These are distinct but somewhat related as well.

Programming endurance, also sometimes referred to as retention, generally describes the rate at which a given FME, once programmed, can maintain a sufficient field strength in the associated ferroelectric layers to enable the readback circuitry to correctly and reliably recover the stored data. This can be measured a number of ways, one common way is elapsed time. So for example, two weeks, two months, two years, etc. are valid ways to consider programming endurance, or the persistence of the data. Refresh operations can be carried out at appropriate times to reset this period. A refresh would essentially involve reading the data and then immediately rewriting the present data state. This would consume power so this is related to the power aspect described above.

Imprinting is related to programming endurance, but generally relates to the imprinting, or setting, of a given polarity in a ferroelectric layer over time. Generally, it has been observed that if a ferroelectric layer maintains a selected polarity over an extended period of time, field drift and reprogramming difficulties can result. Field drift relates to asymmetric distribution of charges over polarity. This is analogous to charge drift in a flash memory cell, and operates the same way; as the data ages, the programmed field strength can decrease. It is presumed that adjacent reads can also induce reductions in programmed field strength (analogous to read disturb in flash memory applications). Imprinting also can enhance reprogramming difficulties in that, the longer or more frequently a ferroelectric layer is subjected to a particular programmed polarity, the harder it may be to overcome and reset that cell.

Fatigue endurance, or wear, relates to the overall operational life of the memory. Imprinting is similar although these may be caused by separate mechanisms. Regardless, over time a ferroelectric layer loses its efficiency in being able to retain an electric field, both based on aging and usage effects. Wear can be expressed in terms of total programming cycles, or the number of times a given FME cell has been programmed. This is analogous to P/E counts in a flash memory. As noted previously, FMEs tend to have wear rates (operational lives) on the order of $10^{10}$ cycles, whereas flash may have operational lives on the order of $10^4$ cycles (or even less as higher numbers of bits are stored per cell).

Latency is a characteristic usually related to the amount of overall time required to perform data accesses on an FME cell. As noted previously, FMEs are significantly faster than other forms of non-volatile memory, such as flash. Typical read and programming (write) latencies for the reading and programming, respectively, of FME cells is on the order of several nanoseconds, ns. As such, FMEs operate substantially at the same rate as conventional DRAMs (or in some cases, faster than conventional DRAMs).

The construction of an FME can affect its performance; for example, it has been found that, generally, a thicker ferroelectric layer will tend to require higher power levels to establish a selected electrical polarity and may have longer read latency characteristics, but the thicker layer will provide better endurance characteristics. Similarly, environmental factors, such as temperature and wear (e.g., program counts, etc.), can affect power, endurance and latency of a given FME based memory construction.

Accordingly, the various embodiments of the present disclosure provide a controller circuit which has the capability of balancing power, endurance, and latency to optimize data storage characteristics in FME cells of an FME based memory controlled by the controller circuit.

In some embodiments, a method includes steps of receiving a data set for storage to a non-volatile memory (NVM) comprising ferroelectric memory cells. A parameter is identified that is associated with the data set or with a target location to which the data set is to be stored in the NVM. An operational mode is selected for the data set based on the selected parameter. The data set is thereafter programmed to the NVM at the target location using a programming profile selected in relation to the selected operational mode. The system can be both reactive and proactive and based on various inputs and profiles.

Various alternative embodiments evaluate the various operational modes, the aspects of the target location, the various parameters including data aging, programming counts, hotness/coldness of the data based on historical or other factors, different types of FMEs, modes based on enhancing power, endurance or latency, further adjustments based on environmental conditions (e.g., temperature), and so on.

Ultimately, the programming profile selected by the controller circuit balances various factors including power (the amount of power required to perform a particular data transfer operation), endurance (the ability of the FME memory to retain a given programmed state), and latency (the time required to transfer data from and to the FME memory).

These and other features and advantages of various embodiments can be understood beginning with a review of FIG. 1, which shows a functional representation of a data processing system 100. The system 100 includes a client (host) device 101 that communicates with a data storage device 102 via an interface 103. The client device 101 may take the form of a personal computer, a smart phone, a workstation, a tablet, a laptop, a gaming system, a microcontroller, a server, an edge device, an Internet of Things (IoT) device, a mass storage array, etc.

The data storage device 102 is configured to store and retrieve data utilized by the user of the client device 101 and may be a local processor memory, a data cache, a server cache, a RAID storage system, a cloud storage system, a solid-state drive (SSD), a hard disc drive (HDD), a hybrid storage device, an array of storage devices, a portable thumb (e.g., USB) drive, etc. The interface 103 can take substantially any form including but not limited to a local wired or wireless interface, a local area network (LAN), a wide area network (WAN), a cloud computing interface, the Internet, etc. Substantially any useful interface protocol can be implemented for the interface 103 including Ethernet, USB, SCSI, SAS, Fibre Channel, PCMI, wireless connections, etc.

Of interest is the data storage device 102, which is shown to include a controller 104 and a memory 106. The controller 104 can include one or more programmable processors that execute program instructions stored in a local memory to carry out various functions, including the control of data transfers between the memory 106 and the client 101 across the interface 103. Additionally or alternatively, the controller 104 can utilize a hardware circuitry such as formed of ASCI (application specific integrated circuits), FPGA (field programmable gate arrays), state machines, or other arrangements of gate logic.

The memory 106 can include any number of useful forms including local memory for the controller, cache memory, buffer, main storage, etc. The memory 106 includes nonvolatile memory (NVM), which will be understood, consistent with the customary usage of this term, as persistent memory that continues to retain information stored therein even after the removal of applied power to the memory. The form of the main data store can take any number of forms, including semiconductor based memory, rotatable data storage memory, tape based memory, etc.

Figure 2:
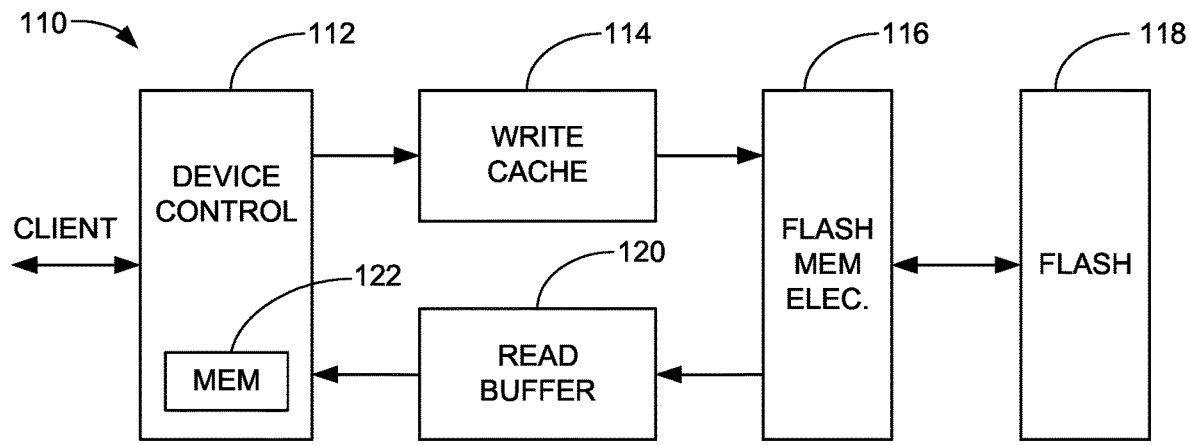
FIG. 2 is a functional block representation of the data storage device of FIG. 1 characterized as a solid-state drive (SSD) in some embodiments.

FIG. 2 depicts aspects of a data storage device 110 that corresponds to the data storage device 102 of FIG. 1 in some embodiments. In FIG. 2, the data storage device 110 is characterized as a solid-state drive (SSD) that utilizes flash memory as a main memory store. This is not limiting, as any number of other forms of data storage devices can be utilized, including but not limited to hard disc drives (HDDs), hybrid drives, tape drives, optical drives, magneto-optical (MO) drives, etc.

The SSD 110 includes a device controller 112 that corresponds to the controller 104 in FIG. 1. A write cache 114 is an internal buffer memory that temporarily stores sets of write data provided from the external host prior to transfer to the main store. These sets of write data may accompany a write command from the requesting client to store the data for future use.

A flash memory electronics circuit 116 operates as a front end to receive and process the sets of write data for transfer to a flash array 118. A read buffer 120 temporarily stores corresponding sets of read back data retrieved from the flash array 118, via the electronics circuit 116, in response to a read command. The read back data are subsequently transferred from the read buffer 120 to the requesting client that issued the read command. Internal controller memory (MEM) 122 may store program instructions, data queues, command queues, map data, and other forms of control data to facilitate these operations.

It is contemplated that at least aspects of the SSD 110 will incorporate ferroelectric memory. This can include aspects of the write cache 114, circuit 116, flash 118 (including as buffers or as the actual main memory in lieu of flash memory cells), read buffer 120 and/or the device control memory 122.

Figure 3:
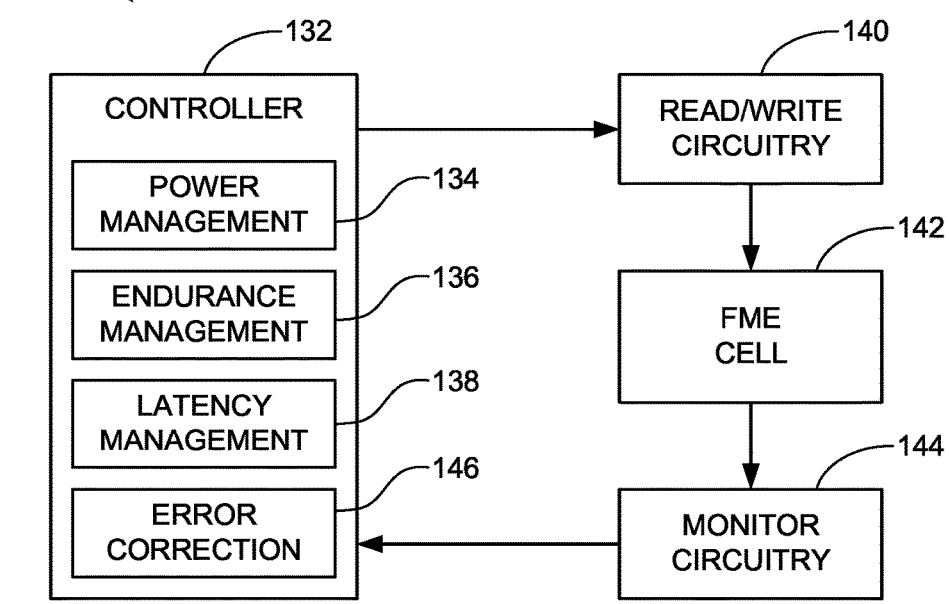
FIG. 3 shows a controller of the data storage devices of FIGS. 1 and 2 configured to manage power, endurance and latency parameters of FMEs of a main memory of the storage device in some embodiments.

FIG. 3 shows a control circuit 130 of the SSD of FIG. 2 in some embodiments. The control circuit includes a controller 132 with various functional control circuits incorporated therein, including a power management circuit 134, an endurance management circuit 136 and a latency management circuit 138. These various functional circuits can be realized using hardware or programmable processing circuitry as described above. Suitable constructions and operations of these circuits will be described below.

A read/write circuit 140 is configured to respective write (program) data bits to individual FME cells, such as depicted at 142, as well as to subsequently read the programmed bits therefrom. In some cases, a refresh operation may be required to rewrite the data after a read operation, depending on the configuration of the FME cell. A monitor circuit 144 is configured to monitor these read and write operations as well as to accumulate and analyze various data states associated with the FME cell 142, as further explained below.

The controller 132 is further shown to incorporate an error correction circuit 146. This can take a number of different constructions, such as but not limited to one or more LDPC (low density parity check) decoders used to correct bit errors in blocks of retrieved data.

The various power, endurance and latency management circuitry 134, 136, 138 can operate adaptively responsive to information obtained from the error correction circuitry 146 (e.g., bit error rates, syndrome counts, etc.). In this way, adjustments may be carried out based on real time and accumulated history data to maintain certain specified levels of performance for the system 130. In one embodiment, a particular data set can be written to a group of FMEs at a target location in the memory using a first profile, after which the data are read and, responsive to at least one read error, a different second profile can be used to rewrite the data set back to the memory. This can further enable the generation of various profiles for different combinations of power, endurance and latency for ongoing and future data sets.

Figure 4:
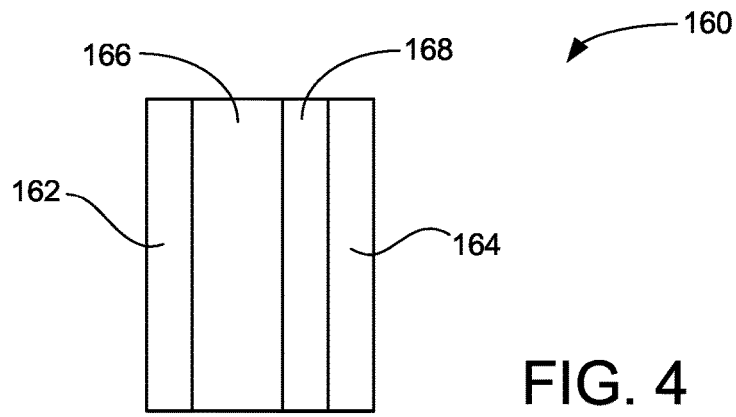
FIG. 4 is a functional block diagram of an FME configured as a ferroelectric tunnel junction (FTJ).

The FME cell 142 depicted in FIG. 3 can take any number of different configurations as desired. FIG. 4 shows a construction of the FME cell 142 as an FTJ 160. The FTJ 160 is a two-terminal device with outer conductive electrode layers 162 164, an inner (programming) layer of ferroelectric material 164, and an optional tunnel barrier layer 166. The tunnel barrier layer 168 is contemplated but not necessarily required as a separate layer, and may be any suitable material such as but not limited to a non-ferroelectric material, a dielectric material, etc.

With the appropriate choice of electrode materials, tunnel barrier, and ferroelectric layer, the resistance of the FTJ can be made to depend on the orientation of the ferroelectric polarization of the ferroelectric layer 166. Stated another way, an FTJ such as the FTJ 160 operates in a manner similar to magnetic tunnel junctions (MTJs), and will present different electrical resistances between electrodes 162, 164 based on the programmed polarization of the ferroelectric layer 166. The differences in electrical resistance will vary depending on construction, but differential resistance values can be greater than $10^4$ ohms.

Figure 5:
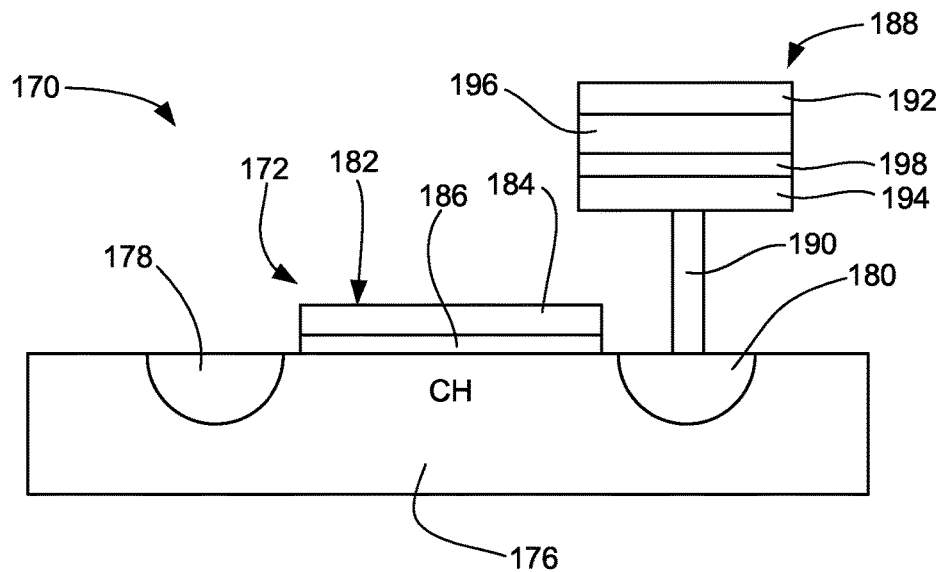
FIG. 5 is a functional block diagram of an FME configurated as an FeRAM memory element having a transistor and a capacitor.

FIG. 5 shows another example construction for each of the FME cells 142 in FIG. 3 as FeRAM cells 170. Each FeRAM cell 170 is characterized as a 1T1C arrangement, although other configurations can be used. The FeRAM cell 170 includes at least one transistor 172 and at least one capacitor 174. Each transistor 172 is formed using a base semiconductor substrate 176 with respective doped regions 178, 180 to form respective source and drain regions. A channel (CH) is formed between these respective regions, as shown. A gate structure 182 is disposed between the source and drain regions 178, 180 adjacent the channel region. The gate structure 182 includes a conductive gate 184 and an isolating region 186.

A capacitor structure 188 extends from the drain region 180 via conductive path 190. The capacitor structure includes upper and lower electrode layers 192, 194. A ferroelectric layer 196 is disposed between the electrode layers 190, 192. As desired, a tunneling layer (not separately shown) can also be provided between the electrode layers. In this way, the control gate voltage applied to electrode conductive gate 184 can be used to determine the electric polarity of ferroelectric layer 196 in relation to the amount of voltage required to place the transistor into a forward conductive state from source to drain 178, 180.

Figure 6:
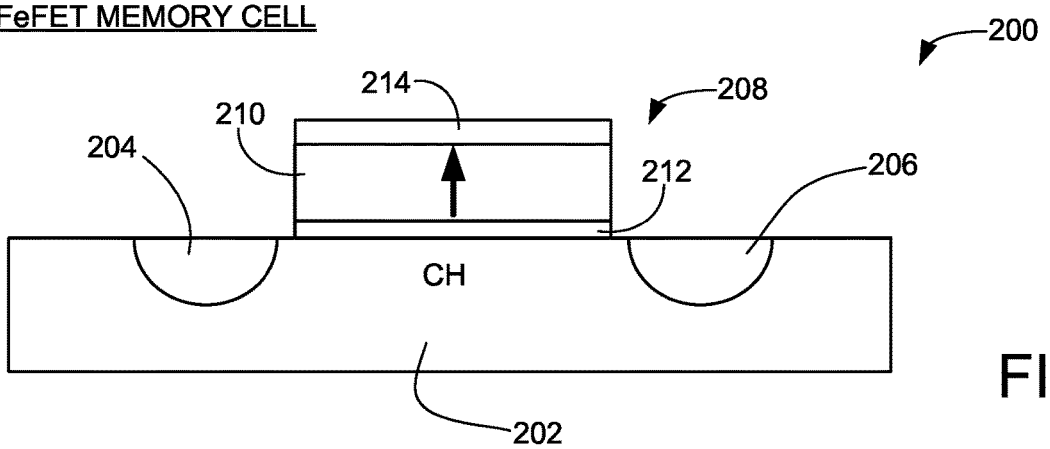
FIG. 6 is a functional block diagram of an FME configurated as an FeFET having a ferroelectric layer.

FIG. 6 shows an FME memory cell element configured as an FeFET 200. The FeFET 200 includes a semiconductor substrate 202 in which doped regions 204, 206 are formed to provide respective source and drain regions. A gate structure 208 is provided between the source and drain regions 204, 206 to manage a channel (CH) therebetween. The gate structure 208 includes a ferroelectric layer 210 sandwiched between an isolating layer 212 and an electrically conductive gate layer 214. It will be noted that a number of different gate structures are known for FeFETs, including a single layer of ferroelectric material, the addition of an insulative layer (as shown), the addition of a metal layer, a laminated arrangement with multiple spaced apart ferroelectric layers, and so on.

While the FTJs 160 and FeRAM 170 may be read destructive and therefore may require a refresh operation after a read operation, the FeFETs 200 are often not read destructive (e.g., truly non-volatile) and therefore may not need the application of a subsequent refresh operation to retain the storage state after a read operation. Many other ferroelectric memory configurations are known in the art and can be arranged as desired, including XTYC configurations where X and Y are some selected integers of transistors and capacitors; hybrid configurations where ferroelectric layers are arranged in various gate structures or other elements, and so on.

Figure 7:
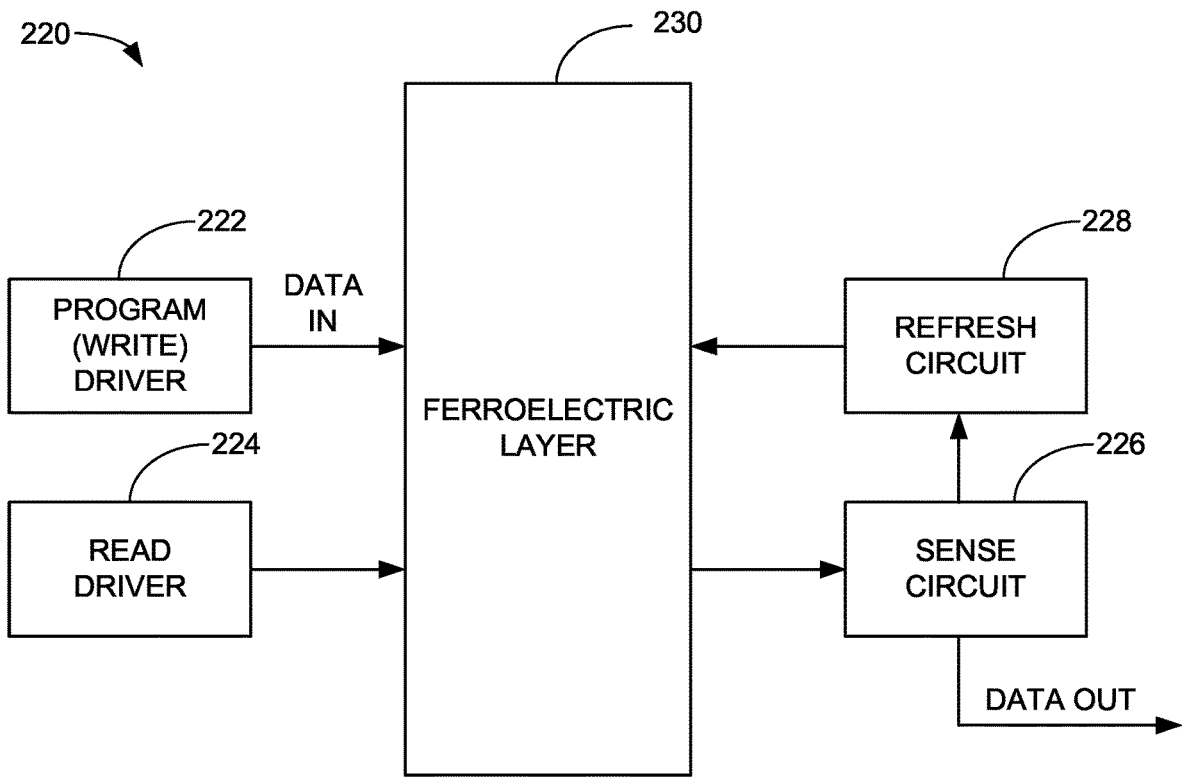
FIG. 7 shows control circuitry used to adaptively program data to and read data from an FME.

FIG. 7 shows a control circuit 220 that can be used to control various FME cells in accordance with various embodiments. This circuitry includes a program (write) driver 222, a read driver 224, a sense circuit 226 and a refresh circuit 228. These various circuits operate to set, sense and, as necessary, retain the programmed electrical polarity of a ferroelectric layer 230 of a selected memory cell.

The program driver 222 is utilized to write (program) data to the respective memory cells of the stack on a cache line basis. This can include the presentation of appropriate voltages and/or currents on the control lines to place the associated ferroelectric layers in the desired programmed orientations.

The read driver 224 places appropriate voltages and/or currents on the respective control lines to enable the sense circuit 226 to sense the programmed orientations of the respective ferroelectric layers.

The refresh circuit 228 operates to refresh the current programmed states of the ferroelectric layers 230 at appropriate times. In some cases, the refresh circuit 158 operates at the conclusion of each read operation, since a read operation destroys the currently stored state. In this situation, once data are read from a selected location in the ferroelectric layers, the refresh circuit buffers and rewrites the previously stored data back to that selected location from which the data retrieved (as is commonly performed with DRAM). That is, as data bits are stored within the stack, data bits may need to be rewritten (or not) as the data are read.

Figure 8:
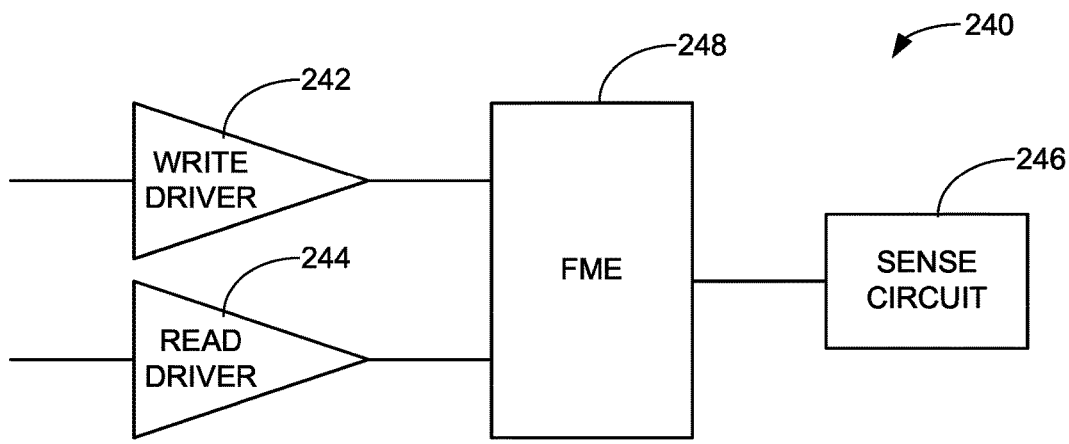
FIG. 8 is a functional block diagram of aspects of the power management circuitry of FIG. 3 in some embodiments.

FIG. 8 provides a functional block representation of aspects of a power management circuit 240, similar to the circuit discussed above in FIG. 3. Other arrangements can be used. The circuit 240 includes a write driver 242, a read driver 244 and a sense circuit 246 which are arranged to operate upon an FME cell 248. The write driver 242 provides driving current and/or voltage at selected power levels configured to establish an electrical polarity in each of the associated ferroelectric layers.

It will be appreciated that higher power levels tend to provide stronger impression of the electrical polarities of the respective ferroelectric layers, whereas lower power levels tend to provide weaker fields in the respective ferroelectric layers. It follows that higher power will cause higher strength fields, which can be used to distinguish among various bit levels when multiple bits are being stored, and also tends to enhance the duration at which the layers will retain the impressed program state.

As such, different profiles may be applied to meet the requirements of a given application. For example, should the FME be incorporated as part of the main memory and specified for long term (e.g., multi-month or multi-year) storage of the data, a first profile may be applied by the write driver to program the data in such a way as to obtain these specified data retention rates. On the other hand, should the FME be part of a temporary cache (such as the read buffer, write cache, local memory, etc. from FIG. 3), a second profile may be applied using a lower power and duration, since the data may not be retained for a relatively long period of time.

Generally, a storage medium can store n bits using $2^n$ storage states; for example, a single bit can be stored using two (2) storage states (e.g., 0 or 1). Two bits can be stored using four (4) storage stages (e.g., 00, 01, 10 and 11). Three bits can be stored using eight (8) storage states (e.g., 000, 001, 010, 011, 100, 101, 110, 111), and so on. The power circuitry of the write driver 242 can thus be used to not only provide a desired storage state to distinguish among various granularities, but can also be used to enhance longevity of the stored state. For example, if data are intended to be stored for only a short period of time, then a lower power rate may be applied during a write operation as compared to a memory intended to provide longer term storage.

Figure 9:
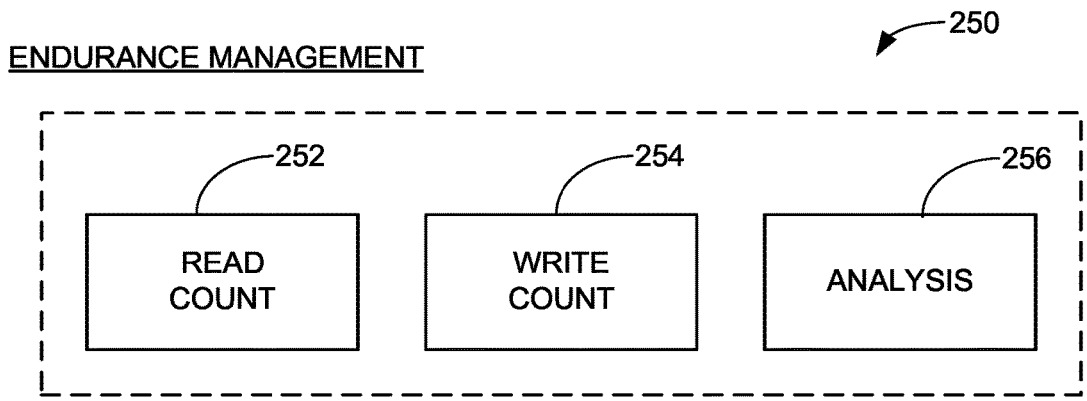
FIG. 9 is a functional block diagram of aspects of the endurance management circuitry of FIG. 3 in some embodiments.

FIG. 9 provides a functional representation of an endurance management circuit 250 that generally corresponds to the circuitry of FIG. 3 discussed above. Other arrangements can be used so FIG. 9 is merely illustrative of one embodiment. The circuit 250 includes a read count circuit 252, a write count circuit 254 and an analysis circuit 256. The management circuit 250 can thus operate to track the duration of how long stored data have been pending (data aging) as well as how often various memory locations have been programmed (wear). In some cases, retained data may be refreshed or relocated based on read disturb, field drift or other effects.

Figure 10:
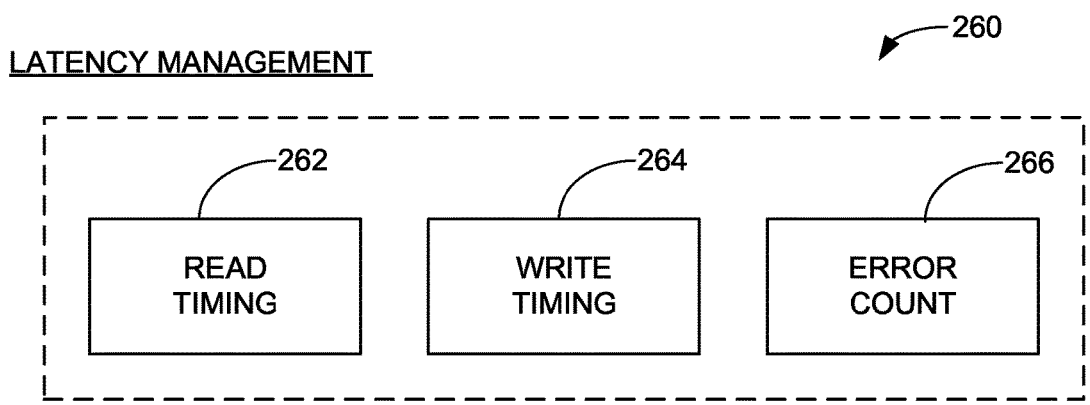
FIG. 10 is a functional block diagram of aspects of the latency management circuitry of FIG. 3 in some embodiments.

FIG. 10 shows a latency management circuit 260 corresponding to the circuitry shown in FIG. 3 above. As before, the arrangement in FIG. 10 is merely illustrative and is not limiting. The circuit 260 includes a read timing circuit 262, a write timing circuit 264 and an error count circuit 266. These elements generally track latency times associated with the transfers of data to and from the various FME cells. In some cases, the circuitry may be able to discern individual transfers. In other cases, the circuitry may provide average calculated transfers based on the transfer of larger sets of data (e.g., based on average transfer rates of large multi-bit blocks of data, individual average transfer rates can be evaluated). The error count circuitry can track the extent to which read retries, adjustments in read sense voltages, etc. are carried out in order to recover the data.

From these descriptions it can be seen that a controller such as the controller 132 in FIG. 3 can adaptively operate to adjust different system parameters during both writes and reads to enhance and optimize power, endurance and latency performance of an FME based memory. In some cases, a suitable endurance level is first specified, and then power levels are selected to achieve that specified endurance level while obtaining the desired latency (and other factors, such as BER, etc.).

Figure 11:
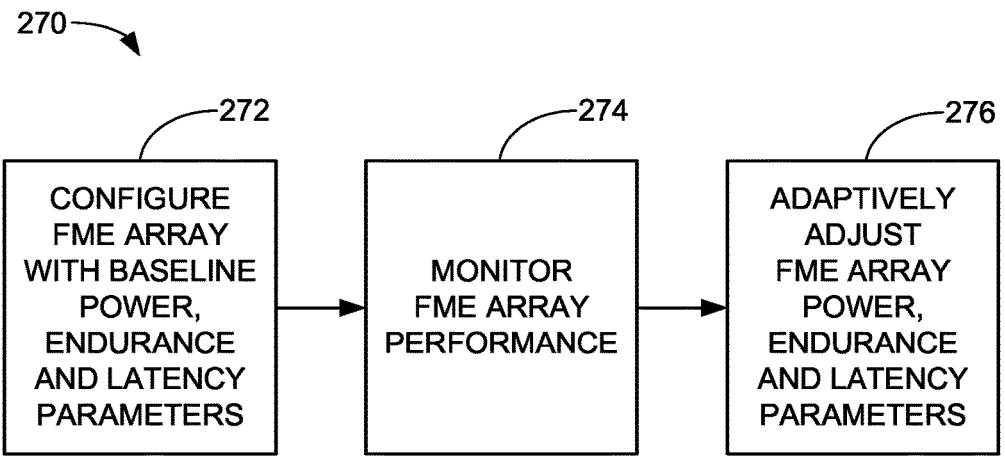
FIG. 11 is a flow chart diagram to illustrate steps carried out in accordance with various embodiments.

FIG. 11 shows a flow diagram 270 to illustrate steps that may be carried out in accordance with some embodiments. At block 272, an FME array is initially configured with baseline power, endurance and latency parameters. Some of these parameters may be inherent from the construction type and features of the FME cells (e.g., FTJs v. FeFETs; number and thicknesses of the ferroelectric layers; and so on). Others of these parameters may be empirically derived based on observed performance. For example, programming operations (either using test data or actual user data) can be carried out in order to establish appropriate power levels (e.g., power values supplied to the write and read drivers; appropriate thresholds for the various sense circuits, etc.).

Thereafter, the system is operated and monitored as shown by block 274. As before, these can include periodic calibration operations or operations involving user data from the client device. At block 276, the monitored data accumulated from block 274 are used to make adjustments to one or more system parameters, such as applied power, thresholds, etc. in order to adaptively adjust the system. It is contemplated that these steps will continue in an adaptive fashion so that the system maintains specified levels of performance. In some cases, history data can be accumulated and used to make these and other parametric adjustments.

Figure 12:
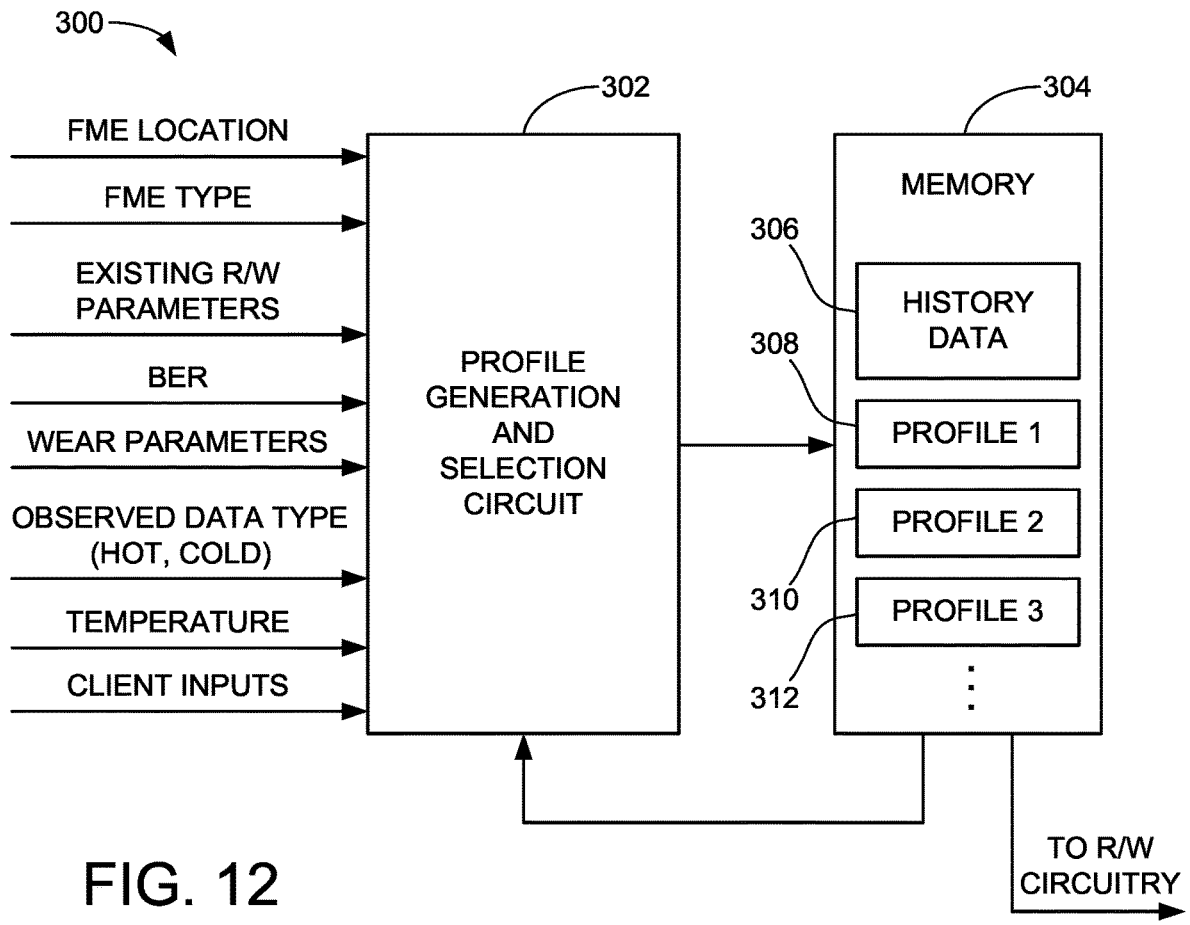
FIG. 12 shows aspects of a profile generation and selection circuit of the controller of FIG. 3 in some embodiments.

FIG. 12 is a functional block representation of an adaptive adjustment system 300 constructed and operated in accordance with further embodiments. The system 300 represents aspects of the controller 132 in FIG. 3, and can be realized using hardware and/or programmable processor circuits.

The system 300 includes a profile generation and selection circuit 302 and an associated memory 304. The circuit 302 operates as described above to generate and select various profiles for the programming, reading and management of data in an associated FME based memory.

Various inputs are shown to be utilized by the circuit 302. Other inputs can be used so that the arrangement depicted in FIG. 12 is merely exemplary and is not limiting. FME LOCATION relates to the physical location of the associated FME(s) being managed within the associated memory. FME TYPE relates to the particular physical construction of the FME(s) (e.g., FTJ, FeRAM, FeFET, 2D, 3D, large, small, multi-cell, etc.).

The EXISTING R/W PARAMETERS input relates to the current read and write (programming) settings for the associated FME(s). As discussed above these can include write current/voltage magnitudes and durations, read sensing current/voltage values, programmed temperature, etc. BER is bit error rate and indicates a measure of current and/or historical error rate performance for the FME(s). Other error rate indications can be used as required.

WEAR PARAMETERS relates to program/erase (P/E) counts or other accumulated parameters associated with historical usage of the FME(s). OBSERVED DATA TYPE (HOT, COLD) relates to an assessment by the system of the relative importance of the data as utilized by the client. Hot data are retrieved on a relatively frequent basis, while cold data tend to be retrieved infrequently (if at all). This parameter can be tracked by the controller based on LBA or other block addressing indications from commands processed from the host. Data aging is a related parameter and can be a measure of how long the data have remained in a particular location since a most recent refresh operation, can be can be determined independently of client command history. Either or both of these can be utilized as part of the profile selection process.

TEMPERATURE is an indication of the current measured or estimated temperature of the memory array, and can be obtained including through the use of one or more temperature sensors. It will be appreciated that the current temperature may affect a particular read or write operation. Finally, CLIENT INPUTS are directives or hints supplied by the client device with regard to the data, such as an instruction to place the data for short term access or long term storage, etc.

The circuit 302 uses these and other inputs as required to evaluate and select an appropriate profile for a given operation. The memory 304 can be used by the circuit 302 to maintain various data structures including history data 306 and various different profiles 308, 310, 312 (denoted as Profiles 1-3). The various profiles can be derived at a selected granularity, including multiple profiles for the same FMEs for different operational and environmental conditions, separate profile sets for different locations, and so on. The profiles can cover a broad range of parameters including programming, reading, erasure voltage (particularly suitable for FeFETs), program during read refresh operations (particularly suitable for FeRAMs), and so on.

Figure 13:
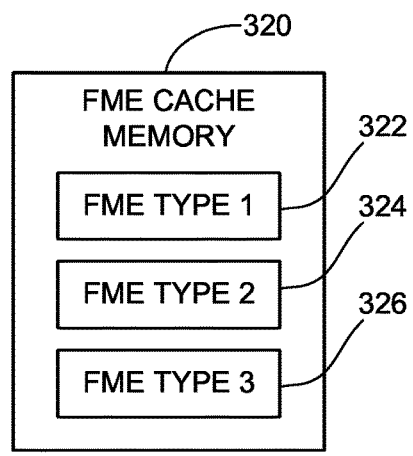
FIG. 13 shows another FME-based memory constructed and operated in accordance with further embodiments.

FIG. 13 shows an FME cache memory device 320 constructed and operated in accordance with further embodiments. The memory device 320 can be incorporated into the various embodiments discussed above, including the SSD 110 of FIG. 2. The memory device 320 takes a hybrid construction with different cache lines formed of different construction types of FMEs for different use cases. Without limitation, this can include FTJs for a first type at 322, FeRAM for a second type at 324, FeFETs for a third type at 326, etc. Other types and varieties of construction can be incorporated into the memory 320, such as multi-FME cells, cells with thicker or thinner ferroelectric layers for different operational conditions, and so on.

Figure 14:
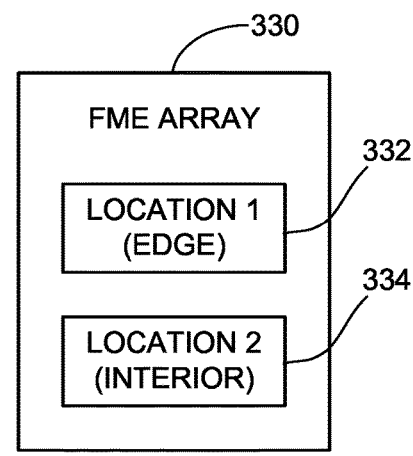
FIG. 14 shows yet another FME-based memory constructed and operated in accordance with further embodiments.

FIG. 14 shows another memory in the form of an FME memory array 330 in accordance with further embodiments and which can be incorporated into the various systems described above including the SSD 110. In some embodiments, the array 330 is used as a stack register, although such is not limiting.

FIG. 14 illustrates how different locations within the array 330 may factor into the decision making process utilized by the circuit 302 in FIG. 12. In one non-limiting example, FMEs within the array 330 that are located near an edge of the array, such as represented at 332, may be provisioned with one set of profiles. FMEs within an interior portion of the array 330, denoted by 334, may be provisioned with a different set of profiles. Factors that can influence such different profiles can include heat dissipation rates, signal loss effects, and so on. Hence, the relative or absolute location of the given set of FMEs being evaluated by the circuit 302 can be taken into account using any desired level of granularity.

It will now be appreciated that various embodiments can provide a number of benefits over the existing art. Operations can be advantageous in which a parameter is identified that is associated with a data set to be written to an NVM, or associated with a target location in the NVM to which the data set is to be stored. A selected profile is identified and used to write the user data set to the NVM accordingly.

In some cases, the selected profile can be adjusted based on a number of factors, such as various operational modes, the aspects of the target location, the various parameters including data aging, programming counts, hotness/coldness of the data based on historical or other factors, different types of FMEs, modes based on enhancing power, endurance or latency, further adjustments based on environmental conditions (e.g., temperature), and so on.

It is to be understood that even though numerous characteristics and advantages of various embodiments of the present disclosure have been set forth in the foregoing description, together with details of the structure and function of various embodiments of the disclosure, this detailed description is illustrative only, and changes may be made in detail, especially in matters of structure and arrangements of parts within the principles of the present disclosure to the full extent indicated by the broad general meaning of the terms in which the appended claims are expressed.

What is claimed is:

1. A method comprising:
receiving a data set for storage to a non-volatile memory (NVM) comprising an array of ferroelectric memory cells (FMEs); and
programming the data set to a group of the FMEs at a target location in the NVM using a selected profile to balance power, endurance and latency associated with the data set, the selected profile retrieved from a memory that stores an additional number of different profiles for the group of the FMEs at the target location for different combinations of power, endurance and latency,
wherein the selected profile is selected from a plurality of profiles stored in a local memory, each of the plurality of profiles associated with a different physical location within the NVM, and
wherein different profiles are applied to program the data based on different location of the FME on the NVM, such that a first profile applied to program the data for the FME incorporated in a main memory is different than a second profile applied to program the data for the FME incorporated in a cache memory.

2. The method of claim 1, wherein the selected profile comprises a magnitude and duration of applied power to each of the FMEs in the group of FMEs at the target location within the NVM to achieve a specified endurance in terms of an overall data retention time for the data set meeting or exceeding a selected endurance threshold.

3. The method of claim 2, wherein the magnitude and duration of applied power are further selected to achieve an average latency during a subsequent read operation that meets or exceeds a predetermined latency threshold.

4. The method of claim 1, wherein the FMEs are each characterized as at least a selected one of ferroelectric tunneling junctions (FTJs), ferroelectric random access memory (FeRAM) memory cells each having at least one transistor and at least one capacitor, or ferroelectric field effect transistors (FeFETs).

5. The method of claim 1, further comprising subsequently reading the data set from the target location in the NVM using a second selected profile associated with at least a selected one of the data set or the target location.

6. The method of claim 1, wherein the first profile applied to program the data for the FME incorporated in a main memory is specified for long term storage of data compared to the second profile applied to program the data for the FME incorporated in the cache memory.

7. The method of claim 1, wherein the data set is received from a client with a write command to store the data set to the NVM with an associated logical address, and wherein the selected profile is based on a determination of a frequency of other commands received from the client to transfer data for the associated logical address.

8. The method of claim 1, further comprising subsequently retrieving the data set from the NVM, performing an error correction operation upon the retrieved data set to correct at least one bit error, and subsequently writing a second data set to the NVM using a second selected profile based on the error correction operation.

9. The method of claim 1, further comprising selecting the selected profile responsive to a data characteristic of the data set, wherein a larger amount of power is used responsive to the data set characterized as a cold data set requiring longer data retention, and wherein a smaller amount of power is used responsive to the data set characterized as a hot data set requiring shorter data retention.

10. The method of claim 1, wherein the selected profile is selected responsive to a total amount of wear in terms of program counts of the target location of the NVM to which the data set is to be written.

11. The method of claim 1, wherein the selected profile is selected responsive to a construction type of the FMEs to which the data set is written.

12. The method of claim 1, wherein the NVM is characterized as a selected one of a write cache, a read buffer, a local processor memory, or a main memory store of a solid-state drive (SSD).

13. The method of claim 1, wherein the NVM is a stack register which forms a portion of a data storage device, the data storage device having a main memory store to store user data from a client device.

14. An apparatus, comprising:
a non-volatile memory (NVM) comprising ferroelectric memory elements (FMEs);
read/write (R/W) circuitry configured to respectively write data to and read data from the FMEs;
a local memory which stores a plurality of profiles for the R/W circuitry associated with different combinations of power, endurance and latency, wherein each of the plurality of profiles associated with a different physical location within the NVM; and
a controller circuit configured to receive a data set from an external client device and to forward a selected profile from the local memory to the R/W circuitry to write the data set to a group of the FMEs at a target location in the NVM, the selected profile operative to balance power, endurance and latency associated with the data set, and
wherein different profiles are applied to program the data based on different location of the FME on the NVM.

15. The apparatus of claim 14, wherein the selected profile comprises a magnitude and duration of applied power to each of the FMEs at the target location to achieve a specified endurance in terms of an overall data retention time for the data set meeting or exceeding a predetermined endurance threshold and to achieve an average latency during a subsequent read operation that meets or exceeds a predetermined latency threshold.

16. The apparatus of claim 14, wherein the selected profile is a first selected profile, the controller circuit is further configured to configure the R/W circuitry to subsequently read the data set from the group of FMEs at the target location using a second selected profile stored in the local memory and associated with at least a selected one of the data set or the target location, and the second selected profile is based on the first selected profile.

17. The apparatus of claim 14, wherein the data set has an associated logical address, and wherein the selected profile is based on a determination of a frequency of other commands received from the client device to transfer data sets having the associated logical address.

18. The apparatus of claim 14, wherein the controller circuit is further configured to direct the R/W circuit to subsequently retrieve the data set from the NVM, perform an error correction operation upon the retrieved data set to correct at least one bit error, and subsequently rewrite the data set to the NVM using a second selected profile provided to the R/W circuit by the controller circuit based on the error correction operation.

19. The apparatus of claim 14, wherein the FMEs are each characterized as at least a selected one of ferroelectric tunneling junctions (FTJs), ferroelectric random access memory (FeRAM) memory cells each having at least one transistor and at least one capacitor, or ferroelectric field effect transistors (FeFETs).

20. The apparatus of claim 14, wherein different profiles are associated with signal loss effects at the physical location of the NVM.

* * * * *